United States Patent [19]

Takanashi et al.

[11] Patent Number: 5,055,936
[45] Date of Patent: Oct. 8, 1991

[54] CHARGE LATENT IMAGE RECORDING MEDIUM AND RECORDING/REPRODUCING APPARATUS THEREOF

[75] Inventors: Itsuo Takanashi, Kamakura; Shintaro Nakagaki, Fujisawa; Hirohiko Shinonaga; Tsutou Asakura, both of Yokohama; Masato Furuya; Tetsuji Suzuki, both of Yokosuka, all of Japan

[73] Assignee: Victor Company of Japan, Ltd., Yokohama, Japan

[21] Appl. No.: 498,805

[22] Filed: Mar. 23, 1990

Related U.S. Application Data

[63] Continuation-in-part of Ser. No. 301,324, Jan. 24, 1989, Pat. No. 4,831,452.

[30] Foreign Application Priority Data

Mar. 23, 1989 [JP] Japan ................................. 1-71173

[51] Int. Cl.$^5$ ..................... G02B 26/00; H04N 1/028; H04N 1/40
[52] U.S. Cl. ......................................... 358/296; 358/75; 358/909; 356/108; 356/112; 359/250; 359/252; 359/255; 359/245; 359/36
[58] Field of Search ................. 358/471, 75, 909, 300; 350/384, 388, 390, 391, 392, 393, 355, 356, 357, 330; 365/108, 112; 355/219, 222, 210, 211; 430/55

[56] References Cited

U.S. PATENT DOCUMENTS 3,950,167  4/1976  Tutihasi ............................... 430/255

Primary Examiner—George H. Miller, Jr.
Assistant Examiner—Scott A. Rogers
Attorney, Agent, or Firm—Michael N. Meller

[57] ABSTRACT

There is provided a recording medium for recording information in a form of a charge latent image. The recording medium comprises, at least, an electrode through which an electro-magnetic radiation beam passes, a photo-conductive layer (hereinafter abbreviated in a PCL) whose resistance varies when the beam is applied thereto and an insulation layer (hereinafter abbreviated in an IL), the electrode and the layers being laminated to each other. There is further provided an apparatus for recording an image as a charge latent image on the medium described above. The apparatus comprises a guide for guiding an electro-magnetic radiation beam through the electrode, an auxiliary electrode arrangeed to face the madium so as to interpose the PCL and the IL between the electrodes and an unit for applying an electric field across the electrodes. There is still further provided an apparatus for reproducing information prerecorded as a charge latent image on the medium. The apparatus comprises a pickup having a plurality of voltage detection electrodes confronting the charge latent image recorded on the medium, a generator for projecting an electro-magnetic radiation beam toward the medium along a path and a reading head disposed in the path and having at least a photo-modulation layer facing the medium so as to be subject to charge of the charge latent image prerecorded on the medium.

22 Claims, 12 Drawing Sheets

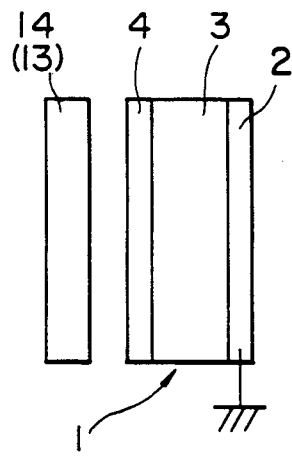
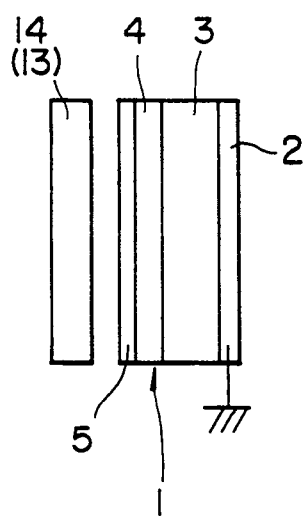
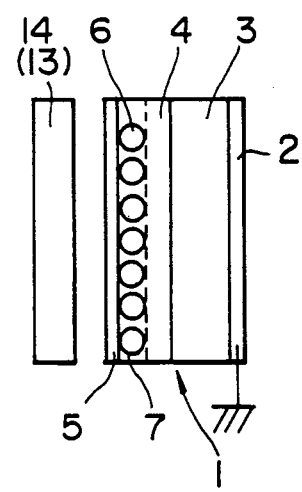
FIG.20    FIG.21    FIG.22
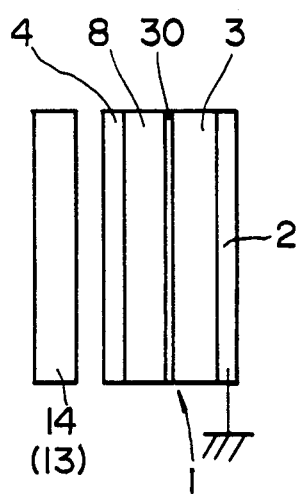
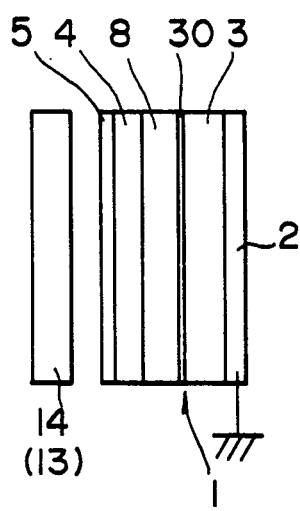
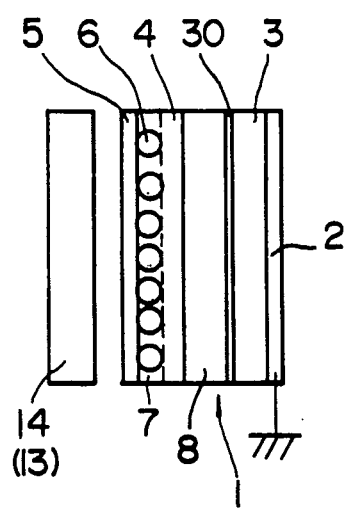
FIG.23    FIG.24    FIG.25

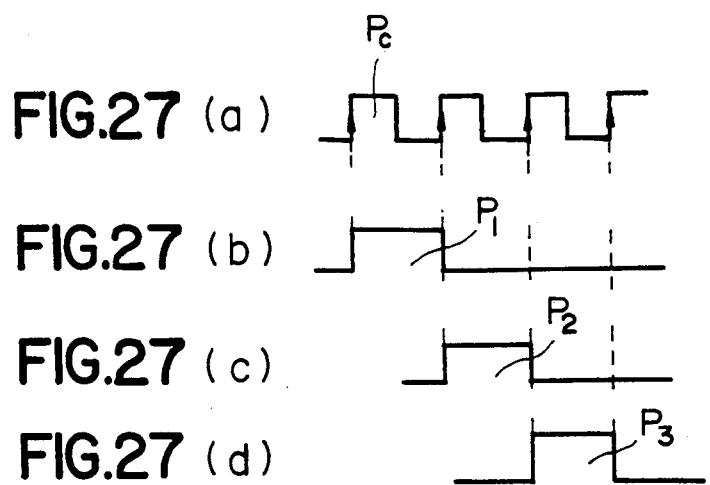
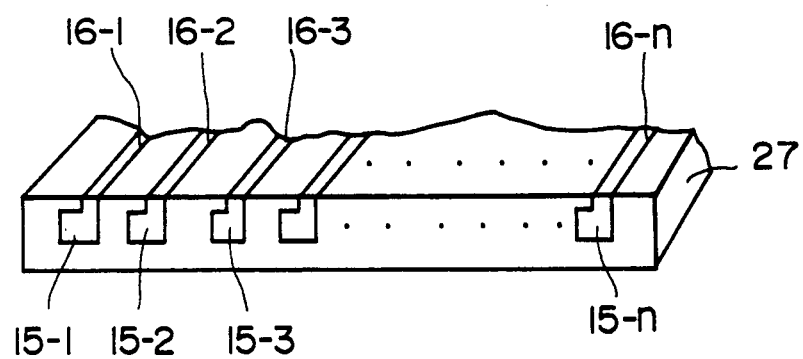
FIG.28

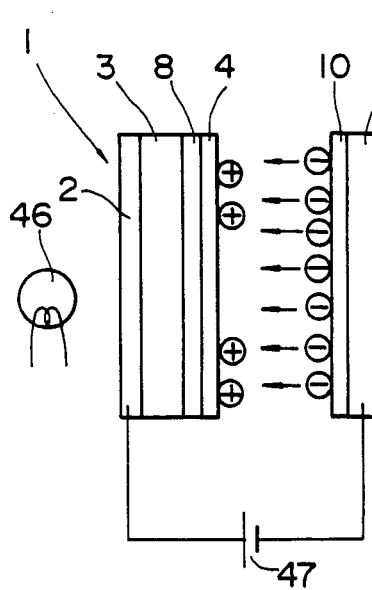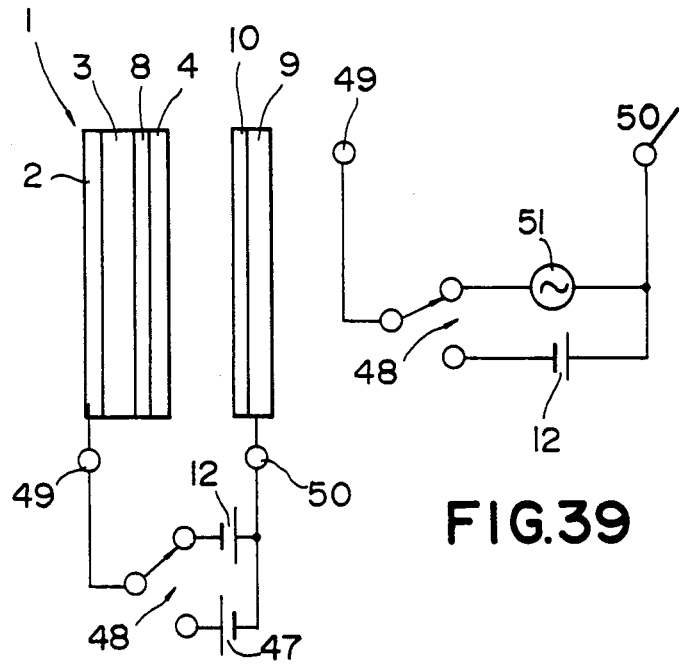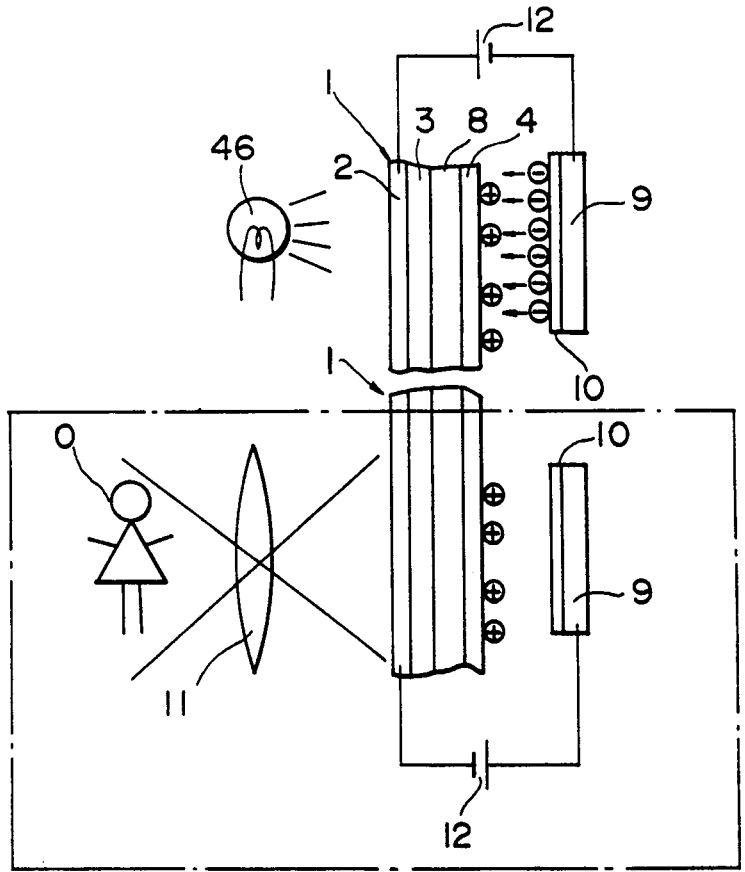
FIG.37
FIG.38
FIG.39
FIG.40

CHARGE LATENT IMAGE RECORDING MEDIUM AND RECORDING/REPRODUCING APPARATUS THEREOF

This is a continuation-in-part (CIP) application of the U.S. application Ser. No. 301,324 filed on Jan. 24, 1989, U.S. Pat. No. 4,831,452.

BACKGROUND OF THE INVENTION

This invention relates to a charge latent image recording medium and a recording/reproducing apparatus thereof.

In compliance with an increased demand for a reproduced image with high picture quality and high resolution in recent years, as well known, various systems such as so-called EDTV (Extended Definition TV) system, or HDTV (High Definition TV) system have been proposed for a television system. In order to obtain a reproduced image with high picture quality and high resolution, it is required to provide an image pickup device capable of producing a video signal from which a high picture quality and high resolution image can be recreated. However, for conventional image pickup devices using an image pickup tube, it is difficult to generate such a video signal. The reasons for this are as follows: Since there is a limit to the reduction of the diameter of an electron beam in the pickup tube, high resolution image reproduction by reduction of the diameter of the electron beam cannot be expected. Alternatively, if the target area of the pickup tube is increased, the level of the output signal will be reduced because of the increased output capacity which is proportional to the area of the target. Therefore, high resolution image reproduction by the increase of the target area cannot be realistic. Furthermore, in the case of an image pickup device for a moving picture, since the frequency range of such a video signal reaches several tens to several hundreds MHz for implementation of the high resolution image, the increase of output capacity i.e. the increase of target area is not preferable.

On the other hand, an increase of pixels or downsizing a pixel of solid state image sensors has difficulties known to the industry.

As stated above, conventional image pickup devices of either a pickup tube or a solid state sensor could not satisfactorily generate such a video signal to provide a reproduced image of high picture quality and high resolution because of the inevitable use of an image sensor for the construction thereof. In order to solve this, the assignee of this application has already proposed an imaging system and a recording system to obtain a high resolution optical image by an image pickup device using a photo-to-photo transducer, and to record such an optical image as a charge image of high resolution onto a charge accumulation layer (or a charge hold layer) by using a photo-to-charge transducer.

Naturally, in the implementation of such imaging system and recording system proposed by the assignee of this application, a comparably capable read out system is required which reproduces such a charge image recorded on a recording medium as an electric signal. However, no satisfactory reproducing apparatus therefore has been available to date.

SUMMARY OF THE INVENTION

An object of this invention is to provide a recording medium for recording information in a form of a charge latent image. The recording medium comprises, at least, an electrode composed of the material which allows an electro-magnetic radiation beam to pass therethrough, a photo-conductive layer (hereinafter abbreviated in a PCL) member whose resistance varies when the electromagnetic radiation beam corresponding to a charge latent image intended to be recorded is applied thereto and an insulation layer (hereinafter abbreviated in an IL) member composed of dielectric material, the electrode and the members being laminated to each other. Another object of this invention is to provide an apparatus for recording an image as a charge latent image on the recording medium described above. The apparatus comprises a guide for guiding an electro-magnetic radiation beam corresponding to the image intended to be recorded on the recording medium through the electrode, an auxiliary electrode arranged to face the recording medium so as to interpose the PCL member and the IL member between the electrodes and an electric field applying unit for applying an electric field across the electrodes. Still another object of this invention is to provide an apparatus for reproducing information prerecorded as a charge latent image on the recording medium described above. The apparatus comprises an electro-static pickup having a plurality of voltage detection electrodes confronting the charge latent image recorded on the recording medium, an electro-magnetic radiation beam generator for projecting an electromagnetic radiation beam toward the recording medium along a path and a reading head disposed in the path and having at least a photo-modulation layer (hereinafter abbreviated in a PML) member facing the recording medium so as to be subject to charge of the charge latent image prerecorded on the recording medium.

BRIEF DESCRIPTION OF THE DRAWINGS

In the accompanying drawings:

FIGS. 20 to 25 are schematic block diagrams showing examples of a reproducing unit for reproducing the charge latent image carrying the information which has been recorded in the recording medium, according to the present invention;

FIG. 27 shows waveforms for describing the operation of the read head depicted in FIGS. 20 to 25;

FIG. 28 is a perspective view showing an example of the read head depicted in FIGS. 20 to 25;

FIGS. 33 to 40 are schematic block diagrams showing an example of an erasing unit for erasing the charge latent image recorded in the recording medium.

DETAILED DESCRIPTION OF THE INVENTION

Figure 1:
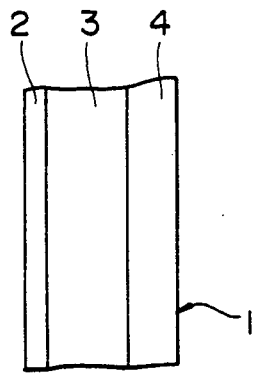
FIGS. 1 to 7 are side sectional views showing a portion of a charge latent image recording medium, according to the present invention.

There will be described preferred embodiments of a charge latent image recording medium and a recording/reproducing apparatus thereof according to the present invention, referring to the accompanying drawings, in detail.

Throughout the drawings, for the sake of simplicity of explanation, like reference numerals and letters are used to designate like or equivalent elements.

At first, FIG. 1 depicts the recording medium 1 composed of an electrode 2, a PCL member 3 and an IL member 4, FIG. 2 the electrode 2, the PCL member 3, the IL member 4 and a charge movement suppressing layer (hereinafter abbreviated in an ESL) member 5, and further FIG. 3 the electrode 2, the PCL member 3, the IL member 4, a fine-grained layer (hereinafter abbreviated in a PCG layer) 7 formed by photo-conductive grains (hereinafter abbreviated in a PCG) 6 and the ESL member 5.

Figure 4:
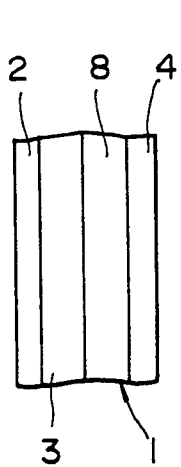

While, FIG. 4 depicts the recording medium 1 composed of the electrode 2, the PCL member 3, a photo-modulation layer (hereinafter abbreviated in a PML) member 8 and the IL member 4, FIG. 5 the electrode 2, the PCL member 3, the PML member 8, the IL member 4 and the ESL member 5, FIG. 6 the electrode 2, the PCL member 3, the PML member 8, the IL member 4, the PCG layer 7 and the ESL member 5 and FIG. 7 the electrode 2, the PML member 8, the PCL member 3, and the IL member 4. In FIGS. 4 and 7, the PCL member 3 and the PML member 8 are arranged vice versa.

Each component of the recording medium 1 shown in FIGS. 1 to 7 is composed of a material as follows: The electrode 2 which is transparent; such as a metal thin film or an electro-conductive film made of $SnO_2$ (a NESA: a name of commodities). The PCL member 3; a thin film of adequate photo-conductive material. The IL member 4; dielectric material with a high insulation resistance, such as an adequate macromolecular film. The ESL member 5; a dielectric thin film such as silicon dioxide or alumina through which a tunnel current flows due to the tunnel effect which occurs when a large electric field is applied. Furthermore, the PCG layer 7 is composed such that the PCG 6 are formed on the IL member 4 as dispersed thereon by adequate means or as distributed thereon as the innumerable PCG 6 are separated from each other by depositing or sputtering photo-conductive material on the IL member 4 through an adequate mask pattern.

The recording medium 1 is then composed by forming each component into a film in order by deposition, sputtering or other processes. The medium 1 may be formed in a disk, a sheet, a tape, a card or other forms.

The recording units shown in FIGS. 8 to 16 are so arranged for recording operation that an imaging lens 11 is provided through which an optical image of an object O is projected onto the electrode 2 of the recording medium 1, an auxiliary electrode 9 is provided facing a side of the recording medium 1, the side being opposite to the other side where the electrode 2 is provided and a power source 12 is connected across the electrodes 2 and 9.

The auxiliary electrode 9 shown in FIGS. 8 to 16 is provided directly facing the side of the recording medium 1, the side being opposite to the other side where the electrode 2 is provided, whereas in FIGS. 11 to 13 and 17 to 19, a dielectric thin film (hereinafter abbreviated in a DL) 10 is laminated to the auxiliary electrode 9 so as to intervene between the recording medium 1 and the auxiliary electrode 9, for stable charge latent image-recording operation which is similar to in the case that a capacitor is connected to a direct current source to charge the capacitor, and a gap between the recording medium 1 and the DL 10 becomes conductive due to a spark discharge developed in the gap.

Under the arrangement described above, when the optical image of the object O is projected onto the PCL member 3 via the electrode 2 through the imaging lens 11, the electric resistance of the PCL member 3 varies accordingly with the intensity distribution of the image projected thereon.

Figure 2:
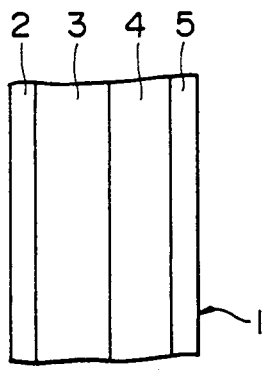
Figure 3:
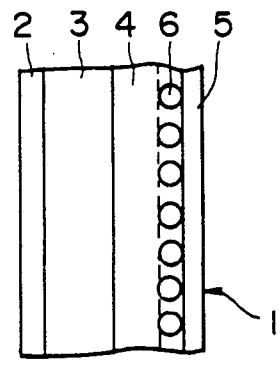
Figure 8:
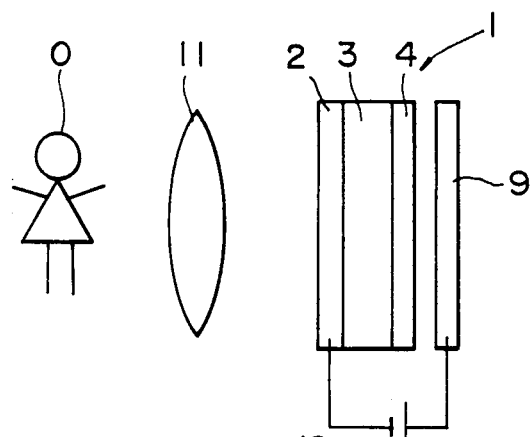
FIGS. 8 to 13 are schematic block diagrams showing examples of a recording unit for recording a charge latent image carrying information intended to be recorded/reproduced by means of the recording medium shown in FIGS. 1 to 3, and those in FIGS. 14 to 19 are for the medium shown in FIGS. 4 to 7 according to the present invention.
Figure 9:
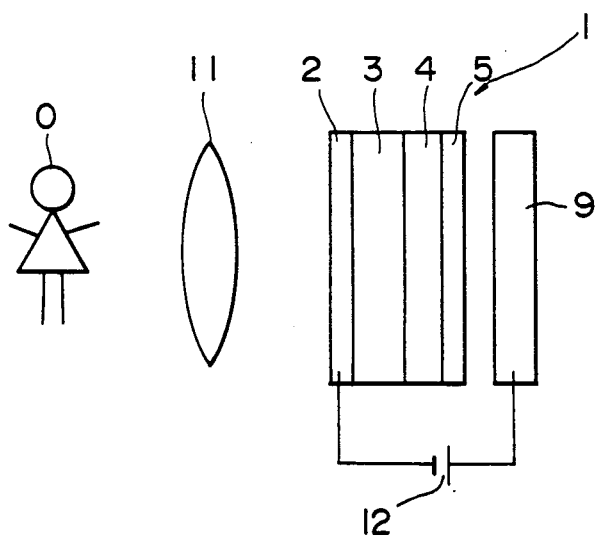
Figure 10:
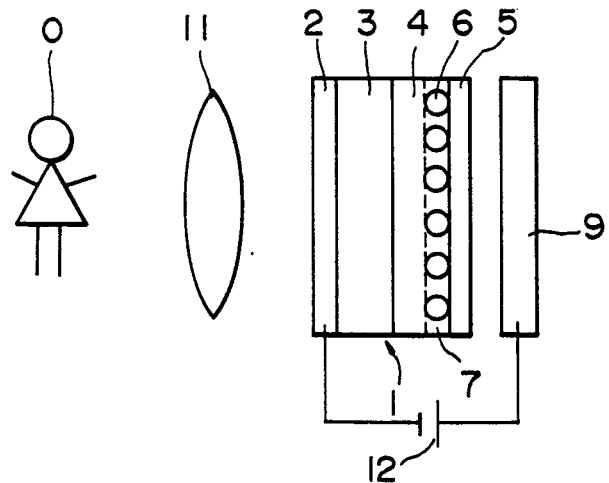
Figure 11:
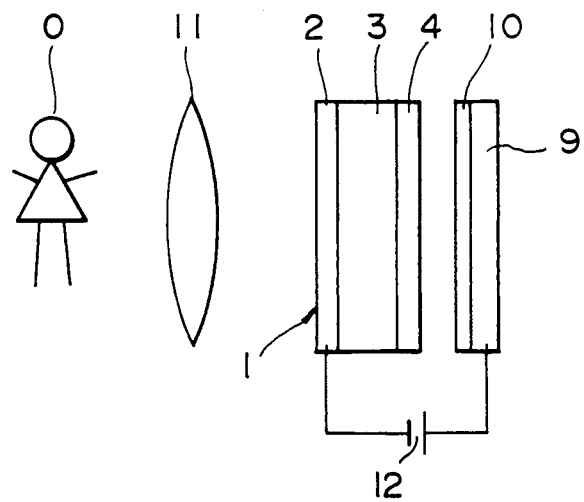
Figure 12:
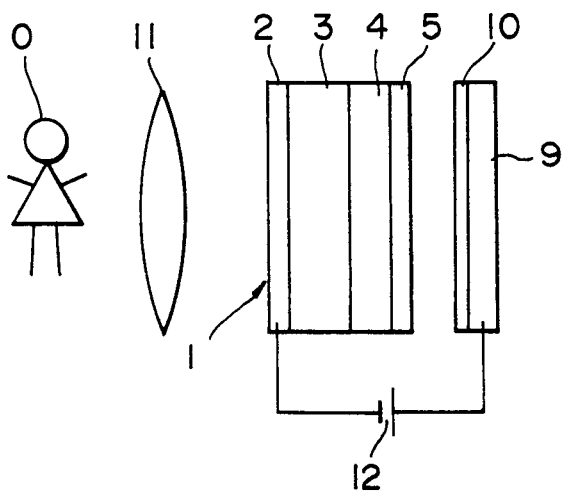
Figure 13:
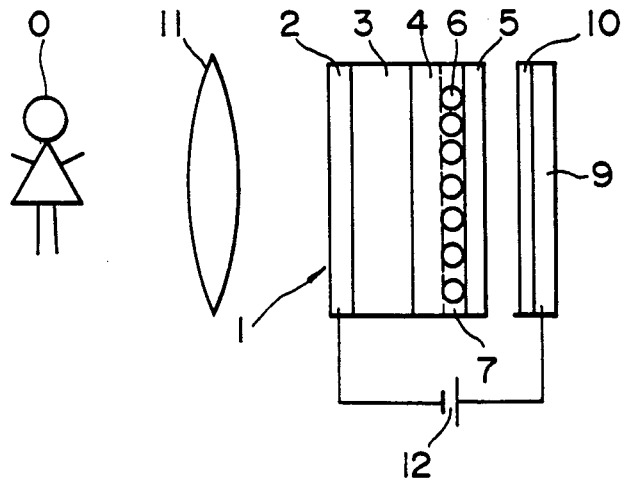

FIGS. 8 and 11 show examples of the recording unit for recording a charge latent image corresponding to the optical information of the object O to the recording medium 1 shown in FIG. 1, while FIGS. 9 and 12 show such examples for the medium 1 in FIG. 2, further FIGS. 10 and 13 are for the medium 1 in FIG. 3.

When the electric resistance of the PCL member 3 varies accordingly with the optical image as described before, an electric field carrying the information of the image is generated between the auxiliary electrode 9 and the border of the PCL member 3 and the IL member 4 due to the voltage applied to the electrodes 2 and 9 by the power source 12.

The charge latent image corresponding to the optical image is therefore formed on the surface of the recording medium 1 facing the auxiliary electrode 9. The recording unit shown in FIGS. 8 and 11 records the charge latent image on the surface of the IL member 4 in FIG. 1.

In the case of the unit shown in FIGS. 9 and 12, the charge latent image is formed on the surface of the ESL member 5 facing the auxiliary electrode 9, and due to a tunnel current flowing through the ESL member 5, the charge latent image is transferred to and is consequently recorded in a vicinity of the border of the ESL member 5 and the IL member 4. The image thus recorded in the vicinity of the border can be stably held thereon for a long period of time, since the image is held between both members 4 and 5.

Furthermore, in the case of the unit shown in FIGS. 10 and 13, the charge latent image is formed on the surface of the ESL member 5 of the medium 1 shown in FIG. 3. The irradiation of light to the PCG 6 causes the pairs of an electron and a hole to be generated therein. The ESL member 5 is transparent to the light for this purpose.

The positive charges of the charge latent image formed on the surface of the ESL member 5 is attracted to the PCG 6 because of the presence of an electric field generated between the electrons of the PCG 6 and the positive charges of the charge latent image, so that the electrons in the PCG 6 are neutralized by the attracted positive charges. In the arrangement, applying an external bias such as from the power source 12, is not necessarily needed as the positive charges and the electrons are attracted each other without such bias. As a result, the holes of the hole-electron pairs are left to form a positive charge latent image corresponding to the object O is therefore recorded in the PCG 6 provided adjacent to the border of the members 4 and 5. The image thus recorded in the PCG 6 can be held stably for a long period of time, in the same manner as the recording unit shown in FIGS. 9 and 12.

Figure 5:
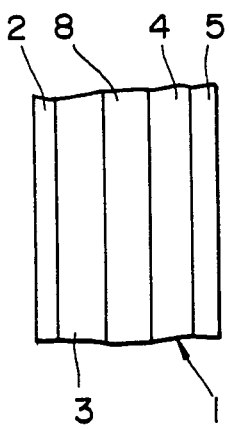
Figure 6:
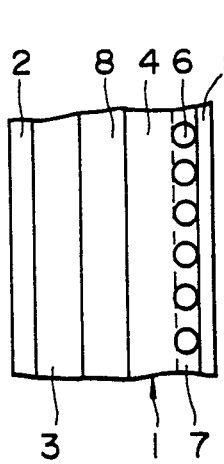
Figure 7:
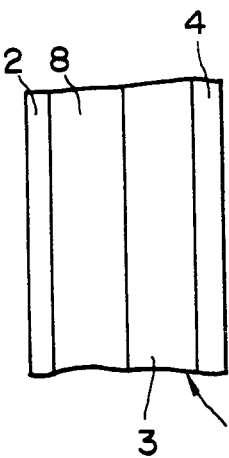

The recording units shown in FIGS. 14 to 19 which employ the recording medium 1 shown in FIGS. 4 to 6 respectively also conduct same recording operation as those shown in FIGS. 8 to 13.

As is already described, FIG. 7 shows the recording medium 1 with the arrangement such that the PCL member 3 and the PML member 8 only are situated reversed in the arrangement shown in FIG. 4. The recording unit for the medium 1 shown in FIG. 7 may be therefore arranged in the same manner as that for the medium 1 shown in FIG. 4.

Figure 14:
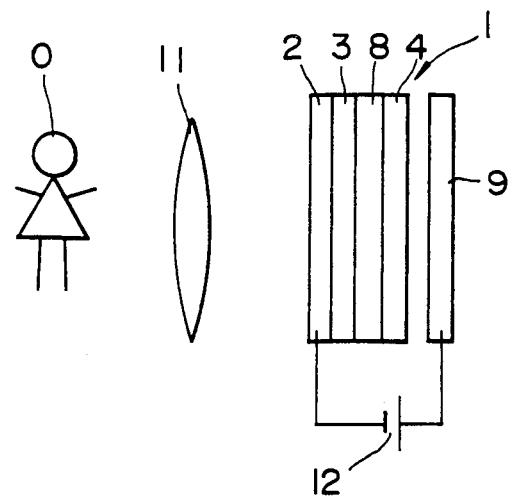
Figure 15:
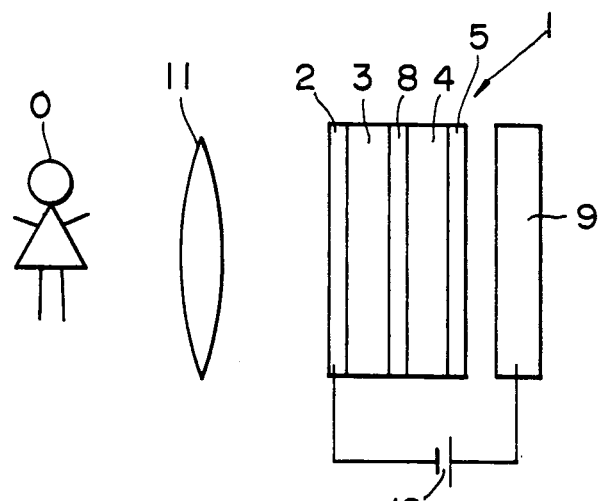
Figure 16:
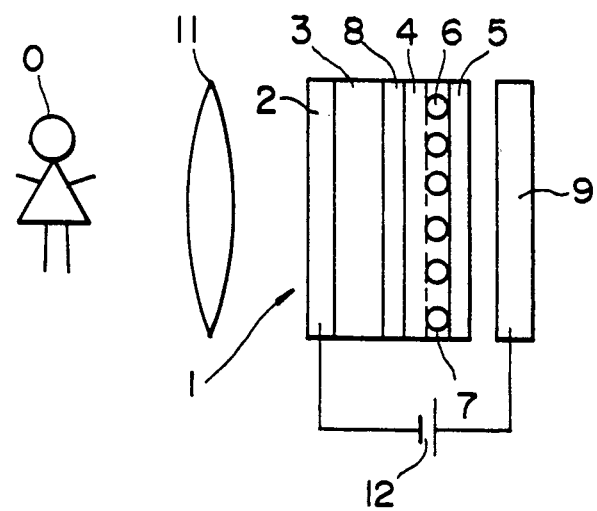
Figure 17:
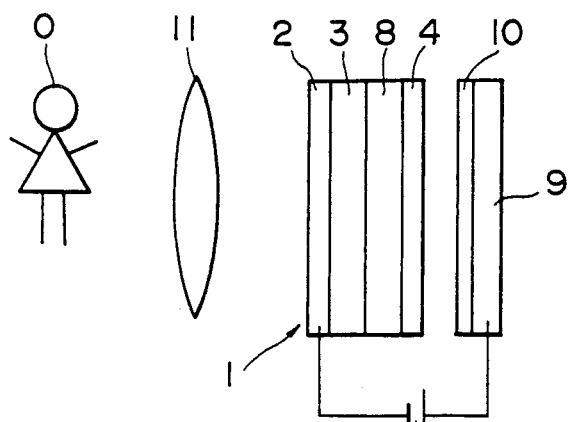
Figure 18:
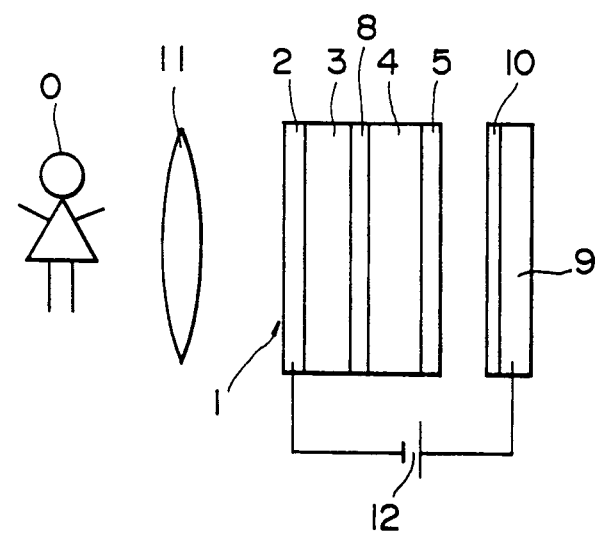
Figure 19:
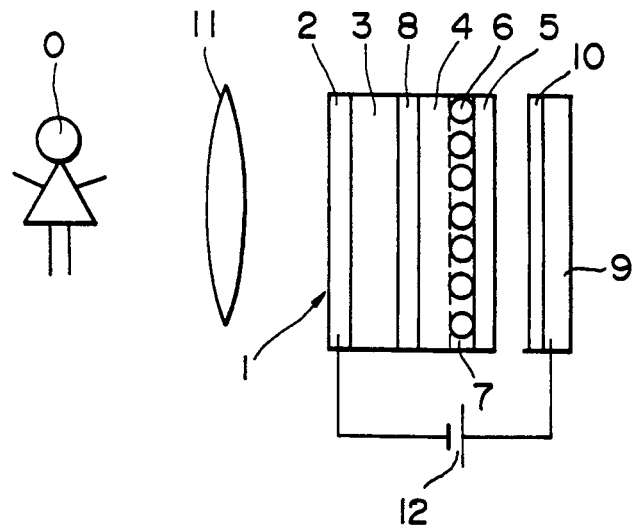

The charge latent image carrying the information thus recorded in the recording medium 1 in FIGS. 8 to 19 is read by means of an electrostatic read head 13 or a read head 14 employing an electro-magnetic radiation beam detection device as shown in FIGS. 20 to 22 or mainly the read head 14 and sometimes the read head 13 as shown in FIGS. 23 to 25 in which a dielectric mirror layer 30 is provided between the PCL member 3 and the PML member 8 of the recording medium 1 shown in FIGS. 14 to 16, the mirror layer 30 reflects a reading light and enables as an optional use, the recording medium 1 to be read out its recorded charge latent image without using the read head 14 or 13.

Figure 26:
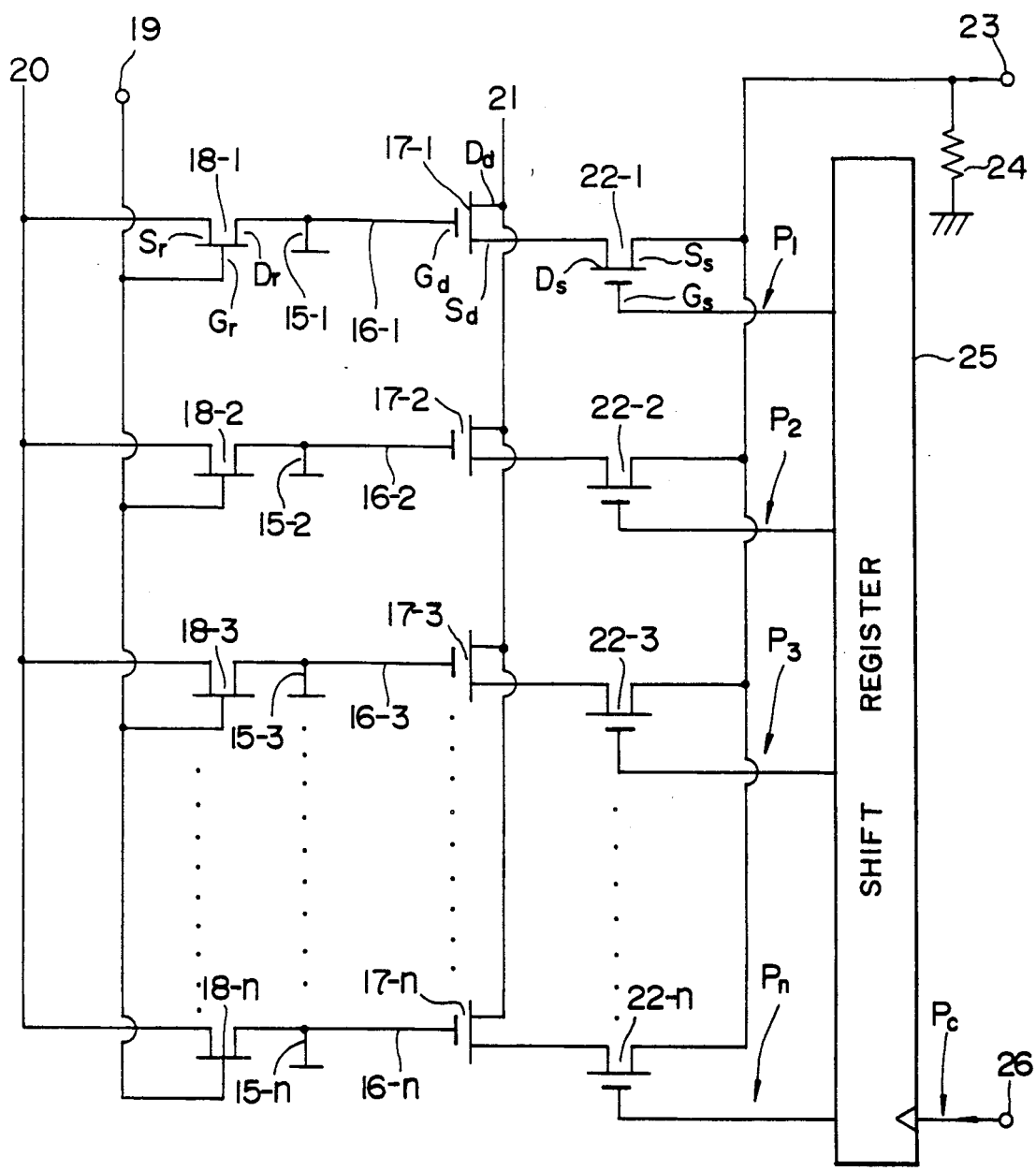
FIG. 26 is a schematic block diagram showing an example of an electrostatic read head depicted in FIGS. 20 to 25.

The read head 13 will be explained with reference to FIGS. 26 to 28. FIG. 26 shows an example of the read head 13 which is a type of electrostatic pickup and is constituted as a plurality of voltage detection-electrodes 15-1, 15-2, 15-3, . . . , 15-n are arranged in the specific pattern so as to confront the charge latent image recorded in the recording medium 1. The electrodes 15-1, 15-2, 15-3, . . . , 15-n are connected to each gate electrode $G_d$ of voltage detection-transistors 17-1, 17-2, 17-3, . . . , 17-n and to each drain electrode $D_r$ of switching field effect transistors 18-1, 18-2, 18-3, . . . , 18-n for resetting operation via wires 16-1, 16-2, 16-3, . . . , 16-n, respectively.

Each of the transistors 18-1, 18-2, 18-3, . . . , 18-n is arranged such that the gate electrode $G_r$ is connected to a resetting pulse input terminal 19, and the source $S_r$ to a power source 20 for applying a reference voltage to each of the electrodes 15-1, 15-2, 15-3, . . . , 15-n and each gate electrode $G_d$ of the transistors 17-1, 17-2, 17-3, . . . , 17-n in the case of the resetting operation.

Each drain electrode $D_d$ of the transistors 17-1, 17-2, 17-3, . . . , 17-n is connected to a power source 21 for applying a constant voltage thereto, while each source electrode $S_d$ thereof to each drain electrode $D_s$ of switching field effect transistors 22-1, 22-2, 22-3, . . . , 22-n, whose each source $S_s$ is connected to an output terminal 23 with a loading resistor 24.

A shift register 25 applies switching pulses $P_1$, $P_2$, $P_3$, . . . , $P_n$ to respective gate $G_s$ of the transistors 22-1, 22-2, 22-3, . . . , 22-n. The pulses $P_1$, $P_2$, $P_3$, . . . , $P_n$ are generated sequentially from the shift register 25 in the order of $P_1 \rightarrow P_2 \rightarrow P_3 \rightarrow$ in the time domain, as shown in FIGS. 27(a) to 27(d), by a clock signal Pc which is applied to the shift register 25 at a clock terminal 26 thereof. The transistors 22-1, 22-2, 22-3, . . . , 22-n are thus turned on sequentially in the time domain.

The voltage corresponding to surface potential distribution of the recording medium 1, which is generated to each of the electrodes 15-1, 15-2, 15-3, . . . , 15-n due to electrostatic induction, is applied to each drain $D_s$ of the transistors 22-1, 22-2, 22-3 . . . , 22-n via each gate $G_d$ and to each source $S_d$ of the transistors 17-1, 17-2, 17-3, . . . , 17-n, and is then sequentially applied to the output terminal 23 from each source $S_s$ of the transistors 22-1, 22-2, 22-3, . . . , 22-n, which are sequentially turned on accordingly with the switching pulses $P_1$, $P_2$, $P_3$, . . . , $P_n$.

When such as the read head 13 which is so constituted that the electrodes 15-1, 15-2, 15-3, . . . , 15-n are arranged as shown in FIG. 26 and the recording medium 1 are relatively moved in the direction orthogonal to the direction in which the electrodes 15-1, 15-2, 15-3, . . . , 15-n are arranged so that a surface of the recording medium is scanned thereby, thus sequential electric signals which carry the information of the two-dimensional charge latent image recorded in the recording medium 1, are generated and applied to the output terminal 23. The read head 13 shown in FIG. 26 is composed such that the electrodes 15-1, 15-2, 15-3, . . . , 15-n, the wires 16-1, 16-2, 16-3, . . . , 16-n, etc., are formed on a base 27 by way of thin film technology.

As is described with reference to FIGS. 26 to 28, the recording units shown in FIGS. 20 to 25 preferably reproduce the charge latent image recorded in the recording medium 1 by means of the read head 13.

Next, the read head 14 will be explained with reference to FIG. 29. The read head 14 is provided with a read element 28 which is constituted such that a dielectric mirror 29 is situated to a surface of the PML member 8 (a material layer for photo-modulation, such as the layer of lithium niobate or nematic liquid crystal having electro-optical effect) which is capable of varying the state of electro-magnetic radiation beams (This will be explained hereinafter.) by an applied voltage, and a transparent electrode 30 is situated to the other surface of the PML member 8. The read element 28 is so arranged that the dielectric mirror 29 faces the IL member 4 of the recording medium 1.

Figure 29:
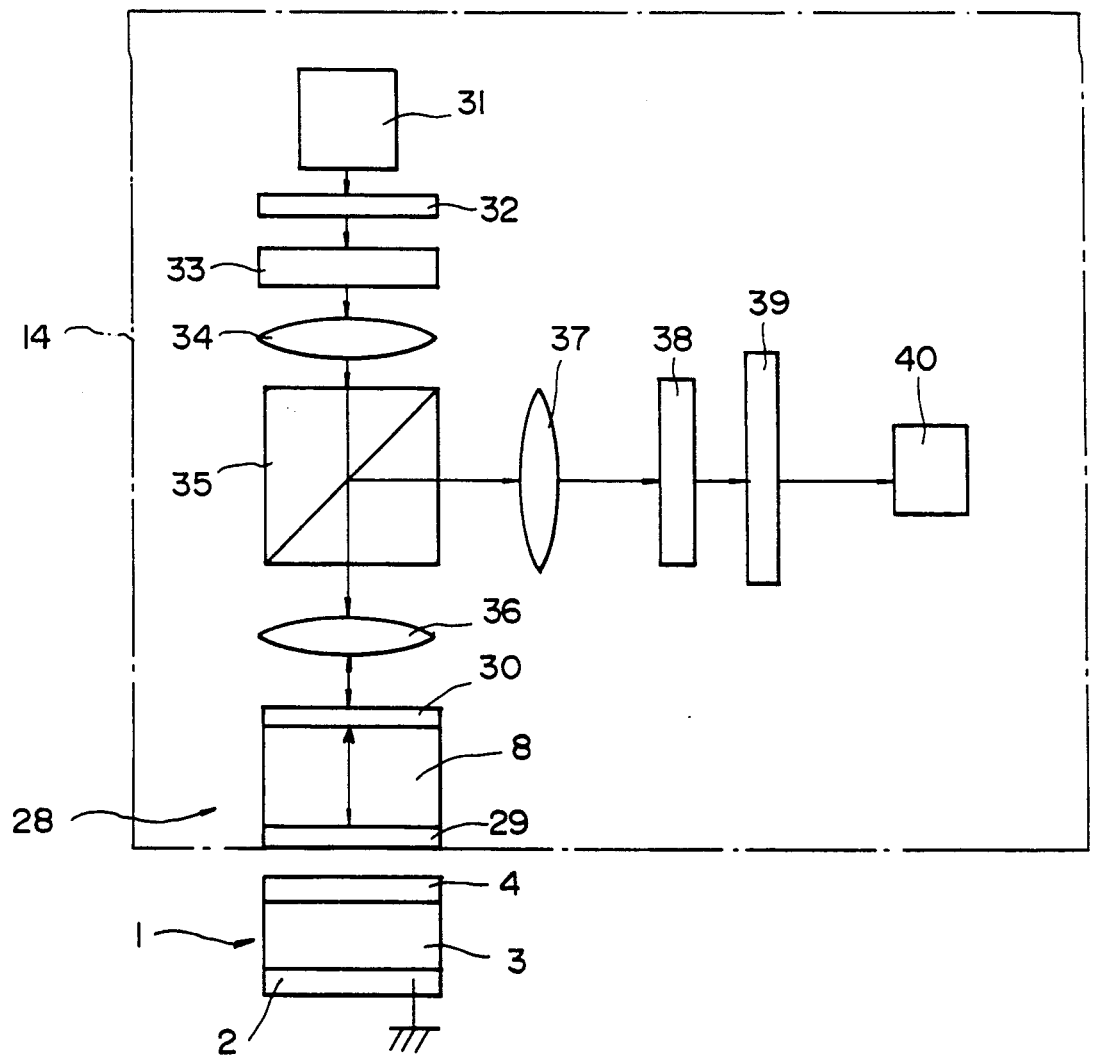
FIG. 29 is a schematic block diagram showing an example of the read head, depicted in FIGS. 20 to 25, for detecting the recorded charge latent image carrying the information as electro-magnetic radiation beams by a detecting device, and then reproducing it as an electric signal.

The recording medium 1 employed in FIG. 29 is that shown in FIG. 1, but that in FIGS. 2 and 3 are also applicable. Furthermore, the medium 1 shown in FIGS. 4 to 7 is provided with the PML member 8 so that the read element 28 is not required when the charge latent image recorded in the medium 1 is read by detecting an electromagnetic radiation beam (reading light).

When the charge pattern is applied to the dielectric mirror 29, in FIG. 29, and electro-magnetic radiation beams are incident to the PML member 8, the electro-magnetic radiation beams pass the PML member 8 and are reflected at the mirror 29, to then again pass the PML member 8 so as to be emitted therefrom.

The state (the angle of the polarization plane) of the electro-magnetic radiation beams which are incident to the PML member 8 and emitted therefrom, is varied or modulated accordingly with the amount of charges distributed as the charge latent image.

The electro-magnetic radiation beam (Hereinafter, this is to be a bundle of laser beams.) which are projected from a laser source 31 (or a light source 31 using a halogen lamp) pass a polarizer 32 to be converted to a bundle of linearly polarized beams, which are incident to a deflector 33. The polarizer 32 is not required if the light source 31 is a laser source of linearly polarized beam (coherent light). The bundle of beams thus incident to the deflector 33 are emitted therefrom as the beams are deflected in two orthogonal directions, similar to the raster which is drawn on a display of a television system.

The bundle of beams thus emitted from the deflector 33 are converted to parallel beams by a collimator 34 and incident to a beam splitter 35. Then, the beams are converged on a lens 36 and incident to the read element 28.

On the other hand, an electric field caused by the charge latent image recorded on the IL member 4 is applied to the PML member 8 through the mirror 29.

Accordingly, the laser beams which are incident to the transparent electrode 30 pass the PML member 8, and then are reflected at the dielectric mirror 29 to again pass the PML member 8, and are emitted from the electrode 30.

As is already described, the state (the angle of the polarization plane) of the laser beams which are incident to the read head 28 and emitted therefrom is varied accordingly with the amount of the charges distributed as the latent image of the recording medium 1.

The laser beams emitted from the read element 28 are in the state that a degree of rotation of the polarization plane is varied accordingly with the two dimensional charge distribution of the charge latent image recorded in the recording medium 1 and the beams are converted to the parallel beams by a collimator 34.

The laser beams emitted from the read head 28 pass the lens 36 and are incident to a converging lens 37 through the beam splitter 35 to be always converged on same position.

A photo-electric convertor 40 is arranged on the location, where the laser beams are converged by the converging lens 37, through a wave plate 38 for setting the optical bias and an analyzer 39 for converting the rotation of the polarization plane into an intensity modulated light so as to obtain an image signal from the convertor 40, whose amplitude is varying in accordance with the charge amount of the two-dimensional charge latent image recorded in the recording medium 1.

The image signal thus obtained from the photoelectric convertor 40 corresponds to the distribution of the charge amount of the two-dimensional charge latent image with high definition. The employment of such as the bundle of laser beams with a diameter of 1 micron as the read light makes it possible to generate an image signal exhibiting such high resolution 300 lines per millimeter.

As is described with reference to FIG. 29, the charge latent image recorded in the recording medium 1 can be preferably reproduced by means of the reproducing unit employing the read head 14 capable of projecting and detecting the electro-magnetic radiation beams.

Figure 30:
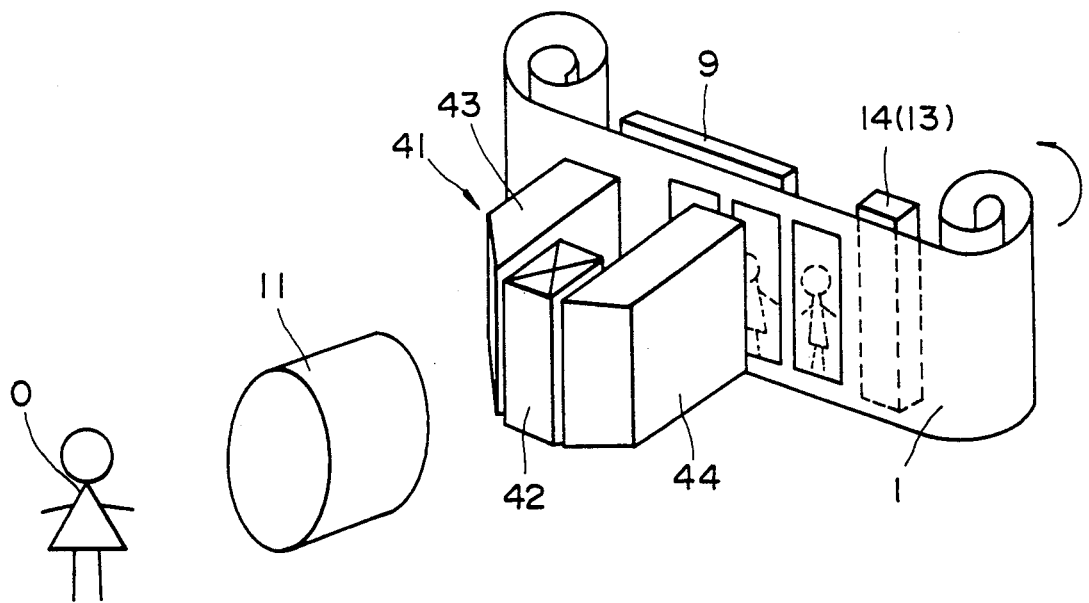
FIG. 30 is a schematic block diagram showing an example of a colour image pickup device provided with a three colour separation optical unit.

FIG. 30 is a perspective view of an example of a colour image recording/reproducing apparatus to which the charge latent image recording/reproducing apparatus according to the present invention is applied. There is provided a three colour separation optical system 41 in the colour image recording/reproducing apparatus in the figure and whose practical construction will be explained with reference to FIG. 31 which is a plan view for explaining the principle of the construction and FIG. 32 which is a perspective view showing the entire construction.

Figure 31:
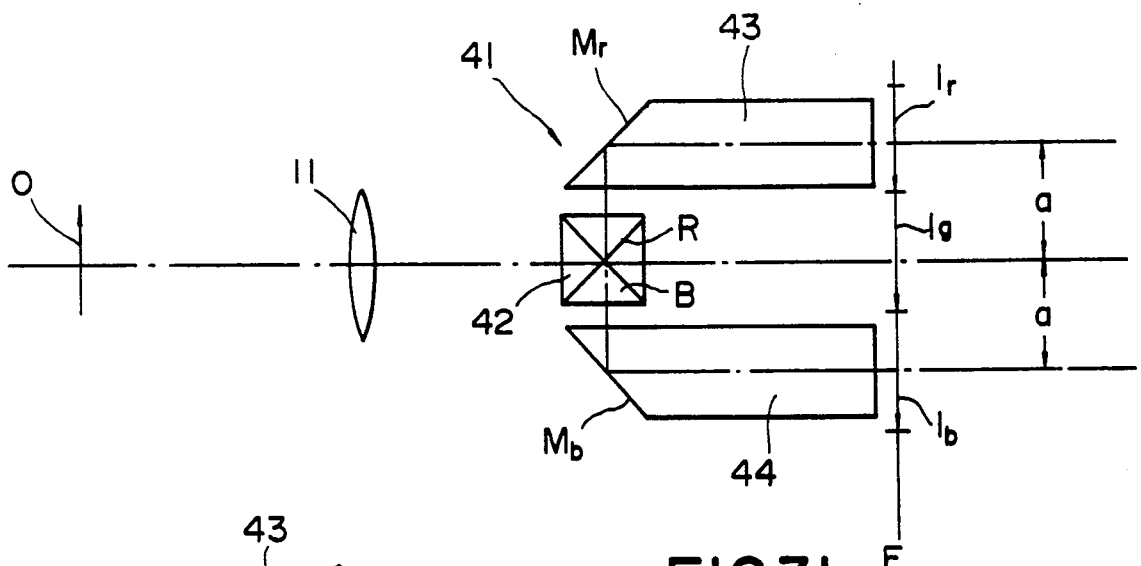
FIG. 31 is a plan view showing an example of the three colour separation optical unit.
Figure 32:
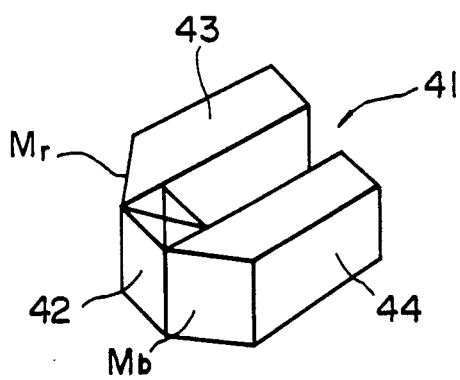
FIG. 32 is a perspective view showing an example of the three colour separation optical unit.

A dichroic mirror (dichroic prism) 42 is, in FIGS. 31 and 32, composed such that a dichroic mirror (R-plane) which reflects a red light and allows to pass through green and blue lights and a dichroic mirror (B-plane) which reflects a blue light and allows to pass through green light and red light are arranged as orthogonal each other.

A prism 43 having a total reflection plane Mr and a prism 44 having a total reflection plane Mb are also provided in FIGS. 31 and 32.

When a light from the object O is incident to the dichroic prism 42 through the imaging lens 11, the green light component of the light is passed through the dichroic mirror (R-plane) and that (B-plane) to be focused on an image formation plane Ig, while the red light component is reflected at the mirror (R-plane), further reflected at the total reflection plane Mr of the prism 43, through which the red light component propagates, and then focuses on an image formation plane Ir which is aligned with and adjacent to the plane Ig. Next, the blue light component is reflected in the mirror (B-plane), further reflected in the total reflection plane Mb of the prism 44, through which the blue light component propagates, then focuses on an image formation plane Ib which is aligned with and adjacent to the plane Ig. The three image formation planes Ig, Ir and Ib are, as described, aligned within a same plane and close each other.

The prism 43 serves to elongate the optical path length for the red light and the prism 44 serves for the blue light so as to arrange the planes Ig, Ir and Ib in the single plane and being abreast to each other.

The amount of the elongation X by the prisms 43 and 44 is set as it is equal to a degree of offset a, that is X=a and is expressed as X=d(n-1)/n, where d denotes the length of the optical paths of the prisms 43 and 44, and n denotes the reflective index of constituent material of the prisms 43 and 44. The amount of elongation X is thus made equal to the degree of offset a by varying the length d and the reflective index n.

It is thus possible to record/reproduce three primary coloured images with a high resolution in parallel by arranging a recording member with reversibility on the plurality of image formation planes by means of a colour separation optical system in which the optical image of an object is projected onto the three image formation planes Ir, Ig and Ib with the image being divided into three colours.

As for the three colour separation optical system used in recording/reproducing of a colour image, a colour separation stripe filter conventionally used in a single chip solid state colour camera or a single tube colour camera may be used.

Next, an erasing unit for erasing the charge latent image recorded in the recording medium will be explained with reference to FIGS. 33 to 40. FIGS. 33 to 36 are explanatory views for the erasing unit for erasing the charge latent image recorded in the IL member 4 of the recording medium 1 shown in FIG. 1 by the recording unit shown in FIG. 11. On the other hand, FIGS. 37 to 40 are for the erasing unit for erasing the image recorded in the medium 1 shown in FIG. 4. Explanation of the erasing unit will be conducted only for FIGS. 33 to 36, since there is no difference in the erasing operation between FIGS. 33 to 36 and 37 to 40.

Figure 33:
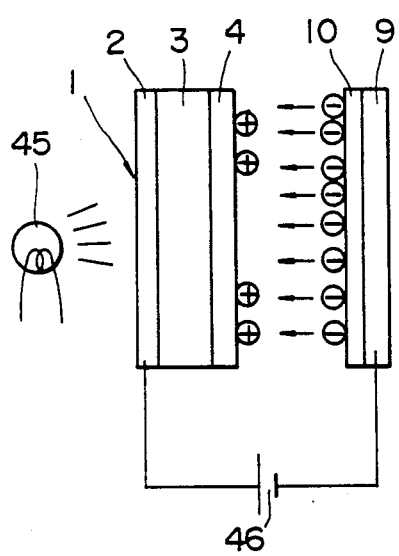

In FIG. 33, there are provided a light source 45 for erasing, and a power source 46 also for erasing which is connected across the electrodes 2 and 9 as having the opposite polarity from that of the power source 12 shown in FIG. 11.

Figure 34:
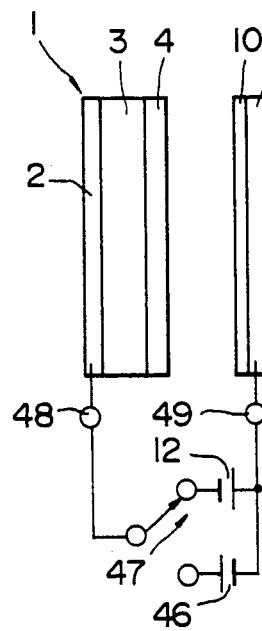
Figure 35:
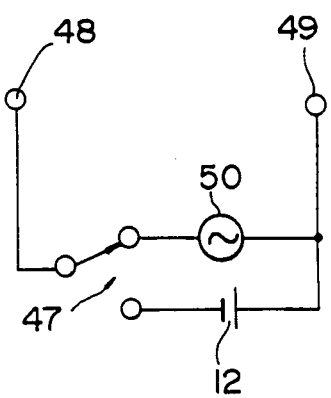

When the transparent electrode 2 is irradiated by the light source 45, pairs of an electron and a hole are generated in the PCL member 3 to lower the electric resistance thereof. The charges which have the opposite polarity from that of the charges of the charge latent image generated on the IL member 4 when recorded, are thus applied to the IL member 4 due to the spark discharge developed across the auxiliary electrode 9 and the IL member 4. The charges which were held on the IL member 4 when recorded, are therefore neutralized so that the charge latent image which has been recorded in the recording medium 1 is erased. FIGS. 34 and 35 show other erasing units. There are further provided a switch 47, and connection terminals 48 and 49.

A fixed contact of the switch 47 whose movable contact is connected to the terminal 48 in FIG. 34, is connected to the power source 12 at the cathode thereof and the other of the switch 47 the power source 46 at the anode thereof. The power source 12 at the anode thereof and the power source 46 at the cathode thereof are together connected to the terminal 49. The switch 47 is set such that the terminal 48 is connected to the power source 12 at the cathode thereof so as to execute recording operation, while the switch 47 selects the power source 46 for erasing operation.

The recording medium 1 in which the charge latent image has already been recorded is omitted in FIG. 35 and there is further provided an alternating power source 50 which is connected across a fixed contact of the switch 47 and the terminal 49 with the power source 12 at the cathode thereof. The switch 47 is set to be connected to the power source 12 at the cathode thereof so as to execute recording operation, while the switch 47 is set to be connected to the alternating power source 50 for applying the alternate current to the terminals 48 and 49 for erasing operation.

The negative charges which have been held on the IL member 4 are thus erased in FIGS. 34 and 35.

It is effective for erasing the charge latent image to arrange the alternating power source 50 so as to control the voltage thereof being gradually reduced, and cutting off the applied alternating current when the polarity thereof is opposite to that applied in the case of recording, at the completion of the erasing.

Figure 36:
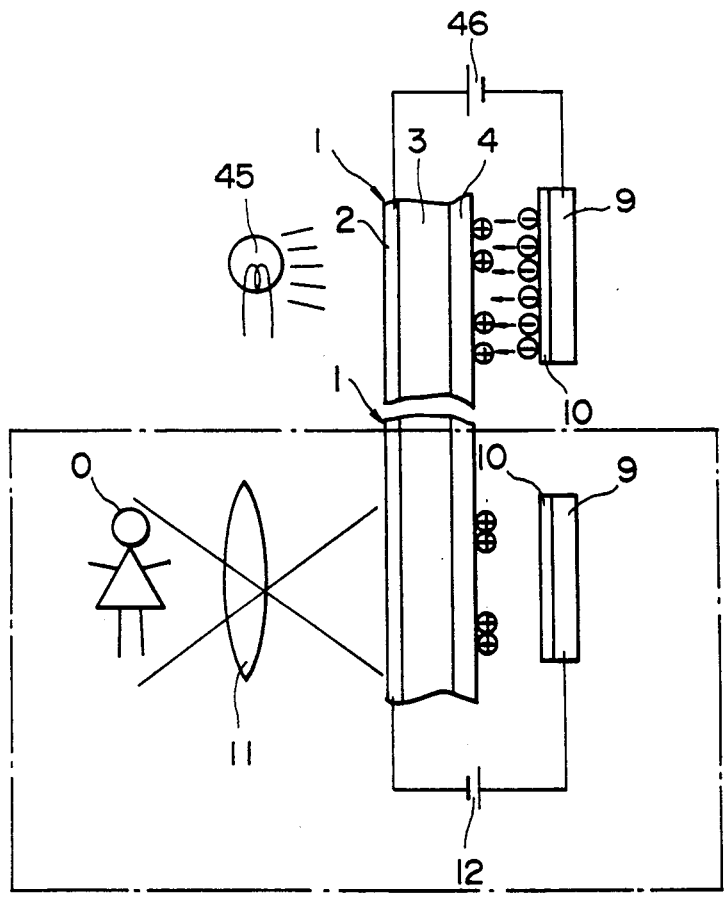

FIG. 36 shows that charge latent image is recorded on the recording medium 1 by the recording unit shown in FIGS. 11 to 13, immediately after the previous charge latent image is erased by means of the erasing unit described in FIG. 33. Namely, it is possible for the system shown in FIG. 36 to erase previous charge latent image and record new image right after the erase.

As is understood from the foregoing, this invention provides the charge latent image recording medium capable of recording an intend information carried by electromagnetic radiation beams as the charge latent image with high resolution, further the recording/reproducing apparatus capable of erasing the charge latent image recorded in the recording medium and repeatedly using the same recording medium to record/reproduce the charge latent image at a high resolution.

What is claimed is:

1. A recording medium for recording information in form of a charge latent image, comprising:
   electrode means composed of a material which allows an electro-magnetic radiation beam to pass therethrough;
   a photo-conductive layer member whose electric resistance varies when the electro-magnetic radiation beam corresponding to a charge latent image intended to be recorded is applied thereto; and
   an insulation layer member composed of dielectric material,
   a laminated body composed of at least said means and members being laminated to each other in order, whereby
   the electro-magnetic radiation beam corresponding to an image intended to be recorded as said information is applied to said laminated body through said electrode means under a state that an electric field is applied across said electrode means and an auxiliary electrode means provided to generate charges of the charge latent image on a surface of said laminated body facing said auxiliary electrode means.

2. A recording medium for recording information in a form of a charge latent image as claimed in claim 1, wherein said laminated body further comprises a charge movement suppressing layer member composed of thin dielectric material having a tunnel effect laminated to said insulation layer member so that said charges of the charge latent image are formed in a vicinity of a border of said insulation layer member and said charge movement suppressing layer member.

3. A recording medium for recording information in a form of a charge latent image as claimed in claim 2, wherein a thin layer of silicon dioxide is employed as said charge movement suppressing layer member.

4. A recording medium for recording information in a form of a charge latent image as claimed in claim 2, wherein a thin layer of alumina is employed as said charge movement suppressing layer member.

5. A recording medium for recording information in a form of a charge latent image as claimed in claim 2, wherein a layer of photo-conductive grains is formed in said vicinity of the border of said insulation layer member and said charge movement suppressing layer member so as to form said charge latent image in said layer of photo-conductive grains.

6. A recording medium for recording information in a form of a charge latent image as claimed in claim 5, wherein a thin layer of silicon dioxide is employed as said charge movement suppressing layer member.

7. A recording medium for recording information in a form of a charge latent image as claimed in claim 5, wherein a thin layer of alumina is employed as said charge movement suppressing layer member.

8. A recording medium for recording information in a form of a charge latent image as claimed in claim 1, wherein said laminated body further comprises a photo-modulation layer member laminated to said photo-conductive layer member and being subject to said charges of the charge latent image so that a polarization plane of a reading light passing therethrough is modulated in accordance with the charges of the charge latent image.

9. A recording medium for recording information in a form of a charge latent image as claimed in claim 2, wherein said laminated body further comprises a photo-modulation layer member laminated to said photo-conductive layer member and being subject to said charges of the charge latent image so that a polarization plane of a reading light passing therethrough is modulated in accordance with the charges of the charge latent image.

10. A recording medium for recording information in a form of a charge latent image as claimed in claim 5, wherein said laminated body further comprises a photo-modulation layer member laminated to said photo-conductive layer member and being subject to said charges of the charge latent image so that a polarization plane of a reading light passing therethrough is modulated in accordance with the charges of the charge latent image.

11. A recording medium for recording information in a form of a charge latent image as claimed in claim 8, wherein a dielectric mirror layer is provided between said photo-modulation layer member and said photo-conductive layer member.

12. A recording medium for recording information in a form of a charge latent image as claimed in claim 9, wherein a dielectric mirror layer is provided between said photo-modulation layer member and photo-conductive layer member.

13. A recording medium for recording information in a form of a charge latent image as claimed in claim 10, wherein a dielectric mirror layer is provided between said photo-modulation layer member and photo-conductive layer member.

14. An apparatus for recording an image as a charge latent image on a recording medium composed of at least an electrode transparent to an electro-magnetic radiation beam radiated from the image, a photo-conductive layer member and an insulation layer member, said apparatus comprising:

guiding means for guiding said electro-magnetic radiation beam corresponding to said image intended to be recorded on said recording medium through said electrode;

an auxiliary electrode means arranged to face said recording medium so as to interpose said photo-conductive layer member and said insulation layer member between said electrode and said auxiliary electrode means; and electric field applying means for applying an electric field across said electrode and said auxiliary electrode means, thus to record said image on said recording medium as said charge latent image.

15. An apparatus for recording a charge latent image as claimed in claim 14, wherein the surface of said auxiliary electrode means facing said recording medium is laminated with a dielectric thin film.

16. An apparatus for reproducing information prerecorded as a charge latent image on a recording medium composed of at least an electrode, a photo-conductive layer member and an insulation layer member, said apparatus comprising:

electrostatic pickup means having a plurality of voltage detection electrodes confronting said charge latent image recorded on said recording medium.

17. An apparatus for reproducing information prerecorded as a charge latent image on a recording medium as claimed in claim 16, wherein said apparatus further comprises transport means for transporting said recording medium with respect to said electrostatic pickup means so that said plurality of voltage detection electrodes scans a surface of the recording medium to produce an electric output signal from said electrostatic pickup means.

18. An apparatus for reproducing information prerecorded as a charge latent image on a recording medium composed of at least an electrode, a photo-conductive layer member and an insulation layer member, said apparatus comprising:

electro-magnetic radiation beam for projecting an electro-magnetic radiation beam toward the recording medium along a path, and reading head means disposed in the path and having at least a photo-modulation layer member facing the recording medium so as to be subject to charges of the charge latent image prerecorded on the recording medium, thereby said electro-magnetic radiation beam passing through the photo-modulation layer member is modulated according to the charges of the charge latent image.

19. An apparatus for recording an image as a charge latent image on a recording medium as claimed in claim 14, wherein said apparatus further comprises means for reversing a polarity of said electric field across said electrode and said auxiliary electrode means for erasing said charge latent image.

20. An apparatus for recording an image as a charge latent image on a recording medium as claimed in claim 14, wherein said apparatus further comprises means for applying an alternating current between said electrode and said auxiliary electrode means for erasing said charge latent image.

21. A recording apparatus as claimed in claim 20, wherein a voltage of alternating current is gradually reduced.

22. A recording apparatus as claimed in claim 21, wherein a polarity of said alternating current is controlled to be opposite to that applied for recording the charge latent image when said alternating current is cut off, at a completion of the erasing the charge latent image.

* * * * *